United States Patent
Yosui

(10) Patent No.: US 10,038,231 B2
(45) Date of Patent: Jul. 31, 2018

(54) SIGNAL TRANSMISSION COMPONENT AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/856,122

(22) Filed: Dec. 28, 2017

(65) Prior Publication Data

US 2018/0123206 A1 May 3, 2018

Related U.S. Application Data

(63) Continuation of application No. 14/938,881, filed on Nov. 12, 2015, now Pat. No. 9,899,719, which is a continuation of application No. PCT/JP2014/082618, filed on Dec. 10, 2014.

(30) Foreign Application Priority Data

Dec. 12, 2013 (JP) .................. 2013-256746

(51) Int. Cl.
| | |
|---|---|
| *H01P 3/08* | (2006.01) |
| *H05K 1/14* | (2006.01) |
| *H05K 1/11* | (2006.01) |
| *H01P 5/02* | (2006.01) |
| *H01L 23/12* | (2006.01) |
| *H01L 23/66* | (2006.01) |
| *H05K 1/02* | (2006.01) |

(52) U.S. Cl.
CPC ............... *H01P 3/08* (2013.01); *H01L 23/12* (2013.01); *H01L 23/66* (2013.01); *H01P 3/085* (2013.01); *H01P 5/028* (2013.01); *H05K 1/118* (2013.01); *H05K 1/147* (2013.01); *H01L 2924/0002* (2013.01); *H05K 1/0251* (2013.01); *H05K 1/0253* (2013.01); *H05K 2201/0191* (2013.01); *H05K 2201/058* (2013.01); *H05K 2201/0919* (2013.01); *H05K 2201/09445* (2013.01); *H05K 2201/09727* (2013.01); *H05K 2201/09845* (2013.01); *H05K 2201/10189* (2013.01)

(58) Field of Classification Search
CPC ................................... H01P 3/08; H01P 3/085
USPC .......................................... 333/238, 246, 33
See application file for complete search history.

(56) References Cited

PUBLICATIONS

Yosui, "Signal Transmission Component and Electronic Device", U.S. Appl. No. 14/938,881, filed Nov. 12, 2015.

*Primary Examiner* — Stephen E Jones
(74) *Attorney, Agent, or Firm* — Keating & Bennett, LLP

(57) ABSTRACT

A signal transmission cable as a signal transmission component includes a laminate including a first thin portion on one of the opposite ends in a first direction and a second thin portion on the other end in the first direction. A portion between the first thin portion and the second thin portion in the laminate is a main line portion. The thickness of the first and second thin portions is thinner than the thickness of the main line portion. The surface on one end in the thickness direction of the laminate defined by the main line portion and the first and second thin portions is a continuous flat surface. A connector for external connection is arranged on the surfaces of the first and second thin portions, on the sides in which each of the thin portions and the main line portion have a difference in level.

17 Claims, 10 Drawing Sheets

FIG.4A
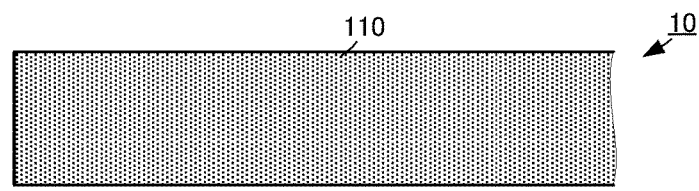
FIG.4B
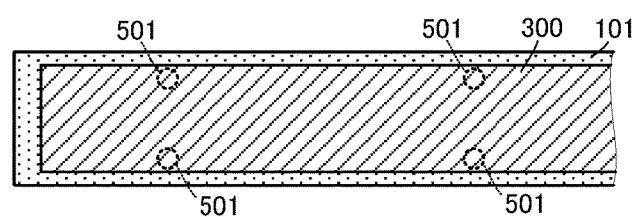
FIG.4C
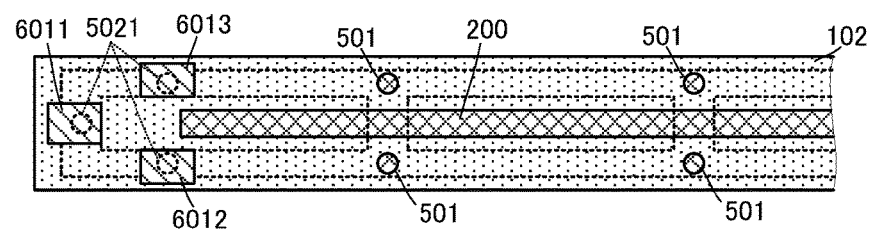
FIG.4D
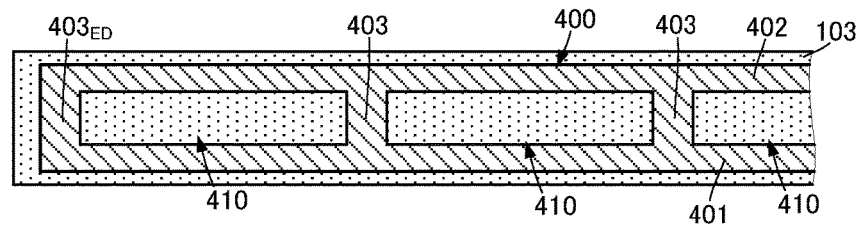

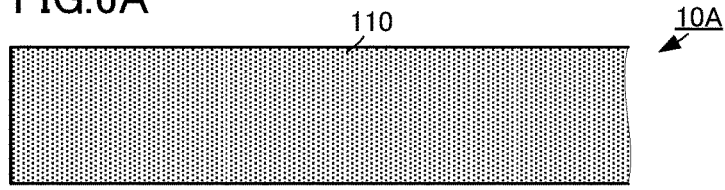
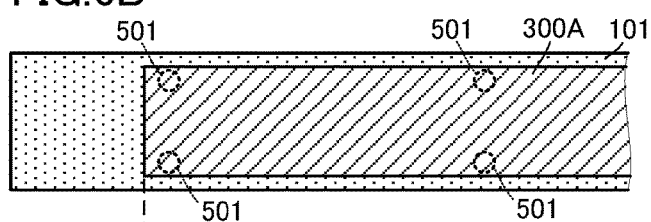
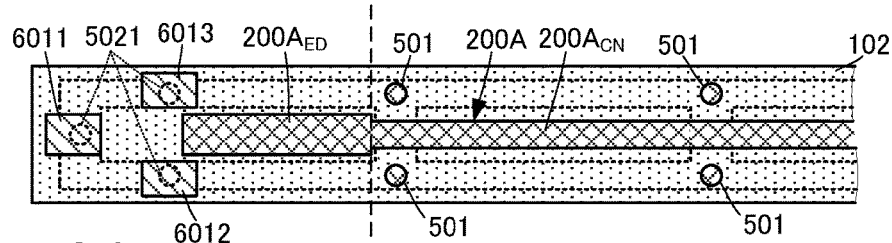
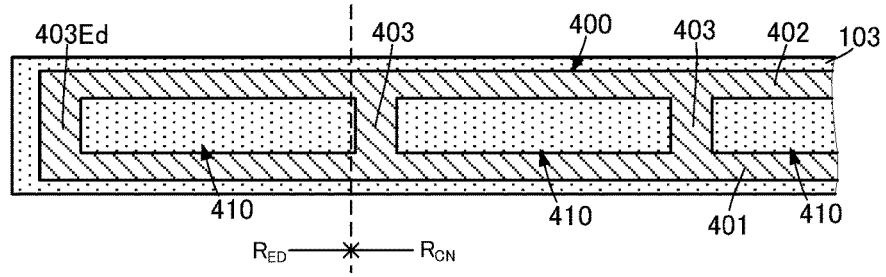

FIG.7A
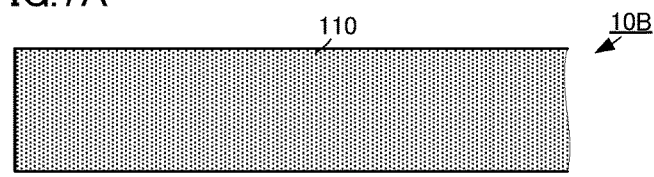
FIG.7B
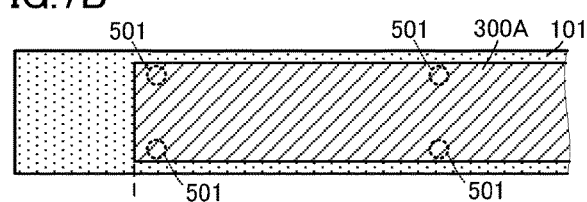
FIG.7C
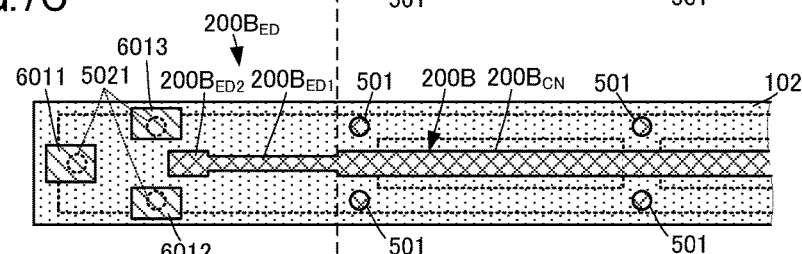
FIG.7D
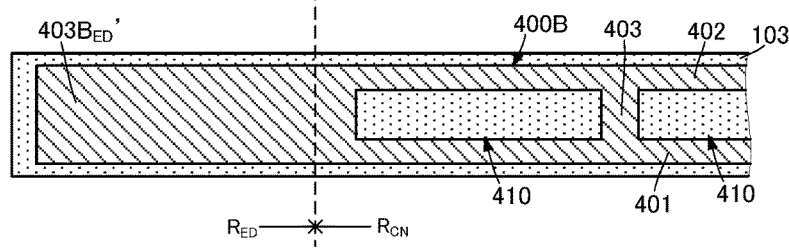

SIGNAL TRANSMISSION COMPONENT AND ELECTRONIC DEVICE

BACKGROUND OF THE INVENTION

1. Field of the Invention

The present invention relates to a signal transmission component including a transmission line including a signal conductor and a ground conductor that are provided in a laminate; and a connector for external connection that is connected to the signal conductor and the ground conductor on at least one of the opposite ends of the transmission line.

2. Description of the Related Art

Conventionally, various structures have been devised and put to practical use as a signal transmission component that transmits a high frequency signal. For example, Japanese Patent Laid-Open publication No. 2013-084931 discloses a signal transmission component (high frequency signal line) in which a signal conductor and a ground conductor are provided in a laminate obtained by laminating a plurality of dielectric layers.

The signal transmission component disclosed in Japanese Patent Laid-Open publication No. 2013-084931 is provided with a linear signal conductor that extends in a direction perpendicular to a lamination direction, and flat plate shaped first and second ground conductors that extend in parallel to the signal conductor. The first and second ground conductors are arranged so as to hold the signal conductor between the first and second ground conductors in the lamination direction.

The laminate has a rectangular flat plate shape in which a length in one of the directions perpendicular to each other is longer than a length in the other direction, and the signal conductor and the first and second ground conductors are provided so as to extend to the opposite ends of the laminate in the longitudinal direction. A connector for external connection is connected to each of the opposite ends of the signal conductor and the first and second ground conductors. The connector for external connection is arranged on the surface of the laminate in parallel to the longitudinal direction and perpendicular to the thickness direction of the laminate.

However, in such a conventional signal transmission component disclosed in Japanese Patent Laid-Open publication No. 2013-084931, the connector for external connection is arranged on the surface of the laminate, which makes the thickness of the signal transmission component substantially equal to a thickness obtained by adding the thickness of the connector for external connection to the thickness of the laminate.

In contrast, in a case of using no connector for external connection, the thickness of the signal transmission component is equal to the thickness of the laminate, which enables the thickness of the signal transmission component to be made thinner than in the case in which the connector for external connection is provided. However, if the connector for external connection is not provided, when the signal transmission component is connected to a mother substrate, joining using solder, an anisotropic conductive film, and the like has to be performed, which makes a joining process cumbersome and complicated and also makes it difficult to obtain high connection reliability. In addition, when the signal transmission component is attached to or detached from the mother substrate, the attachment and detachment between the signal transmission component and the mother substrate cannot easily be performed.

SUMMARY OF THE INVENTION

In view of the above, preferred embodiments of the present invention provide a signal transmission component capable of being easily connected to an external circuit substrate and easily enhancing connection reliability and having a thin shape.

A signal transmission component according to a preferred embodiment of the present invention includes a laminate, a linear signal conductor, a first ground conductor and a second ground conductor, both of which have a flat film shape, and a connector for external connection. The laminate is obtained preferably by laminating a plurality of dielectric layers each of which includes a flat film conductor pattern. The linear signal conductor is defined in the laminate by the conductor pattern and extends in a direction perpendicular to a lamination direction. The flat film shaped first and second ground conductors are defined by a conductor pattern different from the conductor pattern of the signal conductor in an extending direction so as to extend in parallel or substantially parallel to the signal conductor and arranged so as to hold the signal conductor between the first and second ground conductors in the lamination direction. The connector for external connection is connected to at least one of the opposite ends of the signal conductor.

The laminate includes, at an end portion in which the signal conductor is connected to the connector for external connection, a thin portion of which a thickness in the lamination direction is thin and on which no first ground conductor is arranged. The connector for external connection is arranged on a surface of the thin portion, on a side in which the thin portion causes the laminate to have a difference in level.

In this configuration, since the connector for external connection is arranged on the thin portion of which the thickness is thinner than the thickness of a main line portion including a strip line defined by the signal conductor and the first and second ground conductors, the overall thickness of a portion on which the connector for external connection is arranged in the laminate is thinner than the thickness in the conventional configuration.

Additionally, in a signal transmission component according to a preferred embodiment of the present invention, the surface of the thin portion on which the connector for external connection is arranged may preferably be a layer surface of the dielectric layer on which the signal conductor is provided.

In this configuration, since the connector for external connection is able to be mounted on the signal conductor directly, the transmission loss between the signal conductor and the connector for external connection is significantly reduced or prevented while the connection reliability is improved.

Moreover, in a signal transmission component according to a preferred embodiment of the present invention, the second ground conductor may preferably include a plurality of conductor non-formed portions in the extending direction; and the thickness of at least one dielectric layer between the signal conductor and the first ground conductor may preferably be thicker than the thickness of at least one dielectric layer between the signal conductor and the second ground conductor.

In this configuration, the level difference by the thin portion is higher while the characteristic impedance of the main line portion is set to a desired value. This, while the transmission loss is significantly reduced or prevented, makes it easier to achieve a configuration in which the connector for external connection is hard to protrude from the surface of the laminate.

Furthermore, in a signal transmission component according to a preferred embodiment of the present invention, the line width of the signal conductor may preferably be larger in the thin portion than in the main line portion of which the thickness is thicker than the thickness of the thin portion.

In this configuration, the change in characteristic impedance of the thin portion with respect to the main line portion by no first ground conductor on the thin portion is significantly reduced or prevented, so that the increase in transmission loss is also significantly reduced or prevented.

Additionally, in a signal transmission component according to a preferred embodiment of the present invention, the thin portion of the second ground conductor may preferably include no conductor non-formed portions.

In this configuration, the change in characteristic impedance of the thin portion with respect to the main line portion by the increase in capacitance between the signal conductor and the second ground conductor is significantly reduced or prevented, so that the increase in transmission loss is also significantly reduced or prevented.

Moreover, in a signal transmission component according to a preferred embodiment of the present invention, the line width of the signal conductor may be smaller in the thin portion than in the main line portion of which the thickness is thicker than the thickness of the thin portion.

In this configuration, the characteristic impedance of the thin portion is able to be matched by the main line portion, which further significantly reduces or prevents the transmission loss.

Furthermore, in a signal transmission component according to a preferred embodiment of the present invention, the thin portion may preferably be provided on the opposite ends of the signal conductor.

In this configuration, even if the connector for external connection is arranged on each of the opposite ends of the laminate, the thickness of the signal transmission component is significantly reduced.

Additionally, an electronic device according to a preferred embodiment of the present invention is provided with the above described signal transmission component, and a mother substrate that includes a mounting connector to which the connector for external connection is connected. The mother substrate further includes a mother side thin portion on the side of a surface on which the connector for external connection of the signal transmission component is connected. The mounting connector is arranged on the surface of the mother side thin portion of the mother substrate.

This configuration enables the height (thickness) of a connection portion of the signal transmission component and the mother substrate to be thin.

According to various preferred embodiments of the present invention, signal transmission components capable of being easily connected to an external circuit substrate, easily enhancing the connection reliability, and being thin are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4D are plan views of individual layers, showing a configuration of the end portion of the signal transmission component according to the first preferred embodiment of the present invention.

FIGS. 6A to 6D are plan views of individual layers, showing a configuration of an end portion of a signal transmission component according to a second preferred embodiment of the present invention.

FIGS. 7A to 7D are plan views of individual layers, showing a configuration of an end portion of a signal transmission component according to a third preferred embodiment of the present invention.

DETAILED DESCRIPTION OF THE PREFERRED EMBODIMENTS

Figure 1:
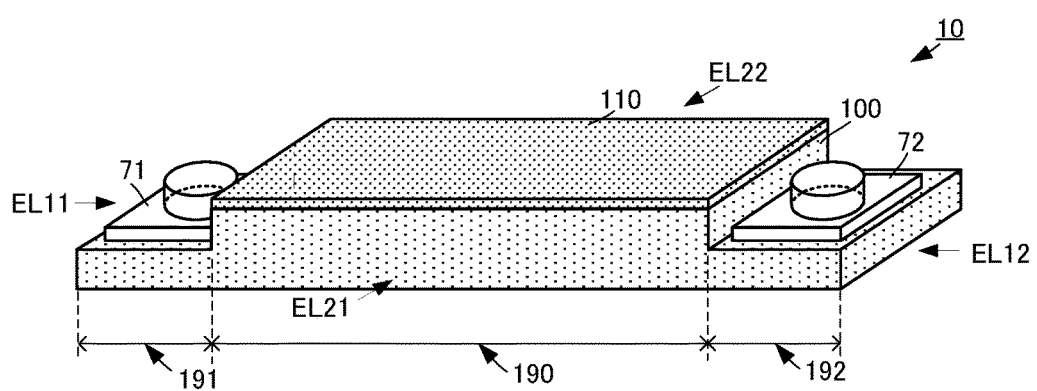
FIG. 1 is an external perspective view of a signal transmission component according to a first preferred embodiment of the present invention.
Figure 2:
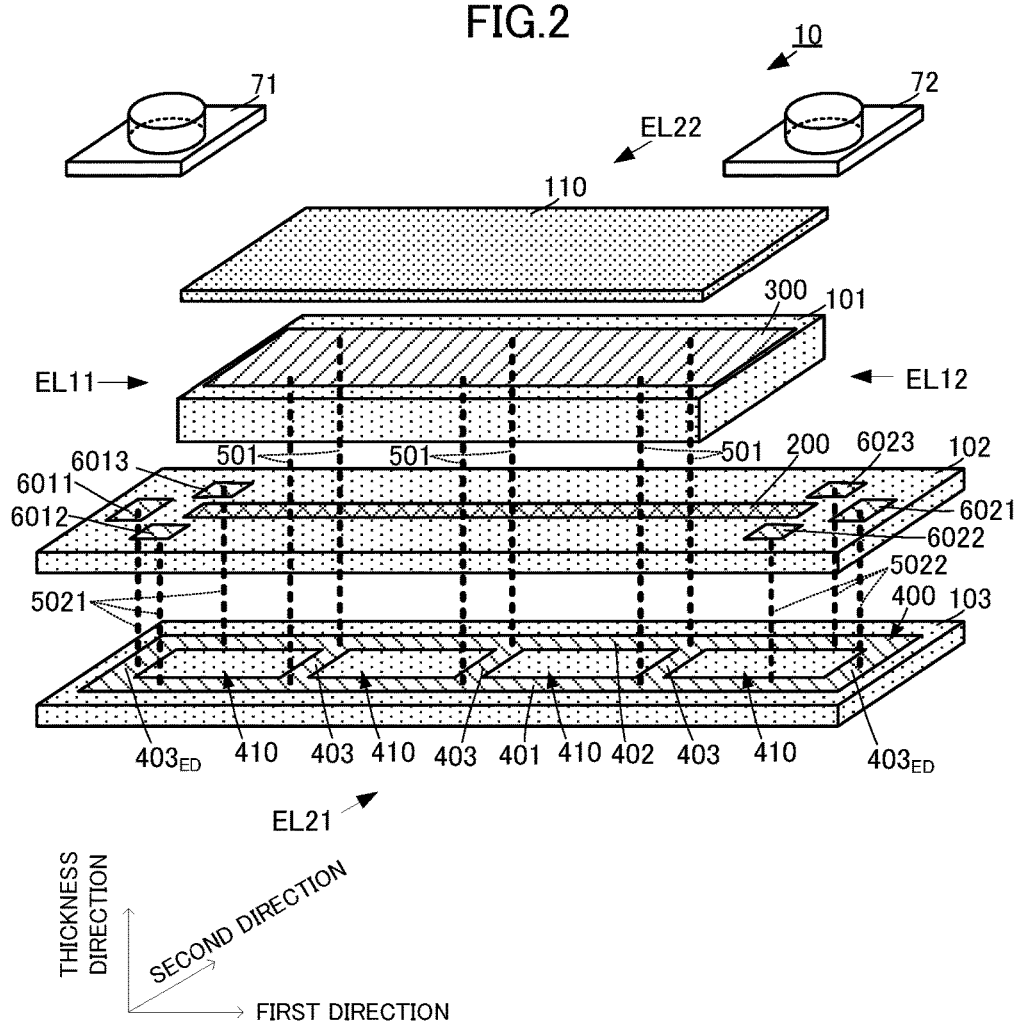
FIG. 2 is an exploded perspective view of the signal transmission component according to the first preferred embodiment of the present invention.
Figure 3:
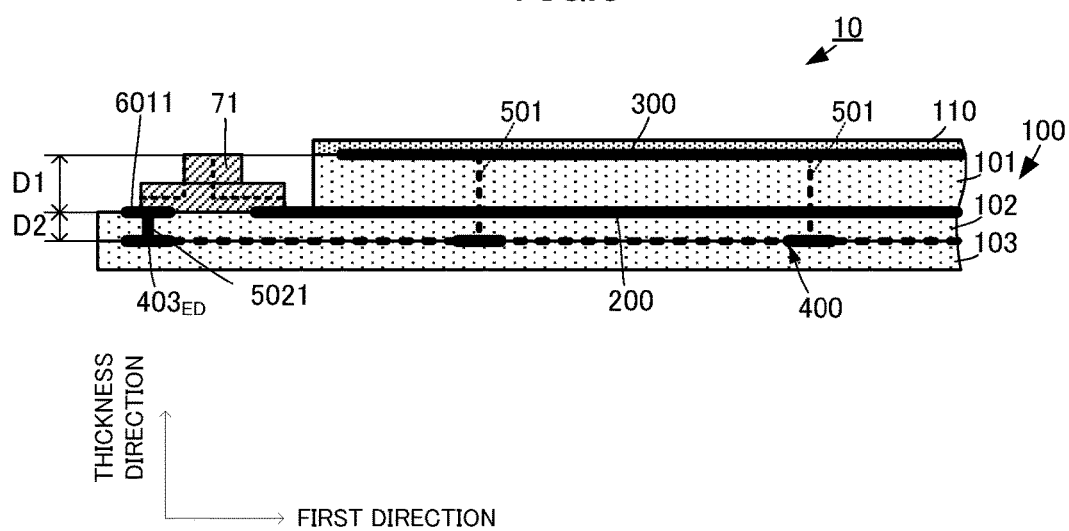
FIG. 3 is a side sectional view showing a configuration of an end portion of the signal transmission component according to the first preferred embodiment of the present invention.

A signal transmission cable as a signal transmission component according to a first preferred embodiment of the present invention will be described with reference to the drawings. FIG. 1 is an external perspective view of the signal transmission cable as the signal transmission component according to the first preferred embodiment of the present invention. FIG. 2 is an exploded perspective view of the signal transmission cable as the signal transmission component according to the first preferred embodiment of the present invention. FIG. 3 is a side sectional view showing a configuration of an end portion of the signal transmission cable as the signal transmission component according to the first preferred embodiment of the present invention. FIGS. 4A to 4D are plan views of individual layers, showing a configuration of the end portion of the signal transmission cable as the signal transmission component according to the first preferred embodiment of the present invention. It is to be noted that the size in the thickness direction, that is, the lamination direction is described with exaggeration in FIG. 1 to FIG. 3. In addition, FIG. 4C shows a shape of a second ground conductor 400 to help clarify how conductor patterns are overlapped with each other in a plan view.

As shown in FIG. 1, the signal transmission cable 10 according to the first preferred embodiment of the present invention is provided with a laminate 100. The laminate 100 has an elongated shape that is long in a first direction and short in a second direction perpendicular to the first direction. The first direction is a signal transmission direction. It should be noted that, in the following description, one of the opposite ends in the first direction of the laminate 100 is EL11, the other end in the first direction is EL12, one of the opposite ends in the second direction of the laminate 100 is EL21, and the other end in the second direction is EL22.

The laminate 100 is provided with a first thin portion 191 on the one end EL11 in the first direction and a second thin portion 192 on the other end EL12 in the first direction. A portion between the first thin portion 191 and the second thin portion 192 in the laminate 100 is a main line portion 190. The thickness of the first thin portion 191 and the second thin portion 192 is thinner than the thickness of the main line portion 190. The surfaces of one end in the thickness direction (surfaces parallel or substantially parallel to the first direction and the second direction) of the main line portion 190, the first thin portion 191, and the second thin portion 192 are flush with one another. In other words, the surface on one end in the thickness direction of the laminate 100 defined by the main line portion 190, the first thin portion 191, and the second thin portion 192 is a continuous flat surface.

A connector 71 for external connection is arranged on the surface of the first thin portion 191 on a side in which the first thin portion 191 and the main line portion 190 have a difference in level. In such a case, the difference in level is equal to and more than the height (thickness) of the connector 71 for external connection, which can cause the connector 71 for external connection not to protrude from the surface of the other end in the thickness direction in the laminate 100 in a state in which the connector 71 for external connection is mounted on the laminate 100.

A connector 72 for external connection is arranged on the surface of the second thin portion 192 on a side in which the second thin portion 192 and the main line portion 190 have a difference in level. In such a case, the difference in level is equal to and more than the height (thickness) of the connector 72 for external connection, which can cause the connector 72 for external connection not to protrude from the surface of the other end in the thickness direction in the laminate 100 in a state in which the connector 72 for external connection is mounted on the laminate 100.

With such a configuration, even when the connectors 71 and 72 for external connection are provided in the laminate 100, the signal transmission cable 10 can be made thin.

Subsequently, a description is made of a more specific configuration of the signal transmission cable 10.

As shown in FIG. 2, FIG. 3, and FIGS. 4A to 4D, the laminate 100 is obtained by laminating dielectric layers 101, 102, and 103. The dielectric layers 101, 102, and 103 are laminated from the one end surface in the thickness direction of the laminate 100 in order of the dielectric layer 103, the dielectric layer 102, and the dielectric layer 101. The dielectric layers 101, 102, and 103 each have an elongated shape. The dielectric layers 101, 102, and 103 are made of an insulating material such as a liquid crystal polymer, for example. The use of a liquid crystal polymer provides a laminate 100 having a low dielectric constant and a high flexibility.

The lengths of the dielectric layers 101, 102, and 103 in the second direction are the same. The lengths of the dielectric layers 102 and 103 in the first direction are the same, and the lengths of the dielectric layers 102 and 103 in the first direction are longer than the length of the dielectric layer 101 in the first direction. The dielectric layers 101, 102, and 103 are laminated on each other so that the center positions of the dielectric layers 101, 102, and 103 in the first direction agree or substantially agree to each other. This provides the first thin portion 191 and the second thin portion 192 on the opposite ends in the first direction of the laminate 100.

In locations where the dielectric layers 101, 102, and 103 are required, the following thin conductor pattern is provided. The conductor pattern is made of metal such as copper, the metal having a high electrical conductivity. For example, the conductor pattern is defined by patterning a sheet of copper obtained by attaching copper on one surface of the liquid crystal polymer.

The dielectric layer 101 includes a first ground conductor 300 provided on the surface (upper surface of the dielectric layer 101) opposite to the dielectric layer 102. The first ground conductor 300 is provided on the substantially whole area of the upper surface of the dielectric layer 101. The whole area of the upper surface of the dielectric layer 101 on which the first ground conductor 300 is provided includes a resist film 110 having the insulation properties. While the resist film 110 is omissible, the use of the resist film 110 ensures the insulation properties to the outside of the first ground conductor 300 and improves the environment resistance of the first ground conductor 300.

It is to be noted that the first ground conductor 300 may preferably have a shape in which the length does not reach at least the opposite ends in the first direction. This prevents the first and second thin portions 191 and 192 from unnecessarily contacting a signal conductor 200 (to be described later) in a mode in which the first and second thin portions 191 and 192 are bent as described below.

The dielectric layer 102 includes a signal conductor 200 and mounting land conductors 6011, 6012, 6013, 6021, 6022, and 6023 provided on the surface (upper surface of the dielectric layer 102) on the side of the dielectric layer 101.

The signal conductor 200 is a linear conductor pattern that extends in the first direction. The signal conductor 200 extends from the first thin portion 191 to the second thin portion 192 through the main line portion 190. The signal conductor 200 is exposed to the external surface of the laminate 100 in the first and second thin portions 191 and 192.

The mounting land conductors 6011, 6012, and 6013 are rectangles and are provided near the end on the side of the first thin portion 191 of the signal conductor 200. The mounting land conductor 6011 is provided between the end on the side of the first thin portion 191 of the signal conductor 200 and the one end EL11 of the laminate 100. The mounting land conductors 6012 and 6013 are provided in the positions of holding the signal conductor 200 between the mounting land conductors 6012 and 6013 in the second direction. The connector 71 for external connection is connected to the portion of the one end of the signal conductor 200, and the mounting land conductors 6011, 6012, and 6013.

The mounting land conductors 6021, 6022, and 6023 are rectangles and are provided near the end on the side of the second thin portion 192 of the signal conductor 200. The mounting land conductor 6021 is provided between the end on the side of the second thin portion 192 of the signal conductor 200 and the other end EL12 of the laminate 100. The mounting land conductors 6022 and 6023 are provided in the positions of holding the signal conductor 200 between the mounting land conductors 6022 and 6023 in the second direction. The connector for external connection is connected to the portion of the other end of the signal conductor 200, and the mounting land conductors 6021, 6022, and 6023.

The dielectric layer 103 includes a second ground conductor 400 provided on the surface (upper surface of the dielectric layer 103) opposite to the dielectric layer 102. The second ground conductor 400 is provided with elongated conductors 401 and 402 that extend parallel or substantially parallel in the first direction, a plurality of bridge conductors 403, and two end bridge conductors 403ED. The elongated conductor 401 is provided near the one end EL21 in the second direction. The elongated conductor 402 is provided near the other end EL22 in the second direction. The distance between the elongated conductor 401 and the elongated conductor 402 is larger than the width of the signal conductor 200. One of the end bridge conductors 403ED connects the end portions of the elongated conductors 401 and 402 on the side of the one end EL11. The other end bridge conductor 403ED connects the end portions of the elongated conductors 401 and 402 on the side of the other end EL12. The plurality of bridge conductors 403 sequentially connect the elongated conductors 401 and 402 at intermediate positions in the first direction at some interval, respectively. This configuration provides the second ground conductor 400 with a structure in which a plurality of conductor non-formed portions 410 are arrayed, respectively, across the bridge conductors 403 in the first direction. Accordingly, with respect to the signal conductor 200, the plurality of conductor non-formed portions 410 and the plurality of bridge conductors 403 are arranged so as to be alternately overlapped in the first direction.

The first ground conductor 300 and the second ground conductor 400 are connected by a plurality of interlayer connection conductors 501 that penetrate the dielectric layers 101 and 102. The second ground conductor 400 and the mounting land conductors 6011, 6012, and 6013 are connected respectively by interlayer connection conductors 5021 that individually penetrate the dielectric layer 102. The second ground conductor 400 and the mounting land conductors 6021, 6022, and 6023 are connected respectively by each of interlayer connection conductors 5022.

The above described structure enables the main line portion 190 of the laminate 100 to provide a transmission line defined by a dielectric stripline in which the first ground conductor 300 and the second ground conductor 400 hold the signal conductor 200 between the first ground conductor 300 and the second ground conductor 400 through at least one dielectric layer in the thickness direction of the laminate 100. In addition, the first and second thin portions 191 and 192 of the laminate 100 provide a transmission line defined by a microstrip line in which the signal conductor 200 and the second ground conductor 400 are arranged to hold at least one dielectric layer between the signal conductor 200 and the second ground conductor 400 in the thickness direction of the laminate 100.

In such a configuration, to begin with, the characteristic impedance is set by the signal conductor 200 and the first ground conductor 300. In such a case, the characteristic impedance by the signal conductor 200 and the first ground conductor 300 is set higher than the characteristic impedance desired for the signal transmission cable 10 (about 50Ω, for example). Then, the characteristic impedance is adjusted by providing the second ground conductor 400, and the signal transmission cable 10 is set to have desired characteristic impedance.

In this case, since the first ground conductor 300 does not have a conductor non-formed portion, the capacitive coupling between the first ground conductor 300 and the signal conductors 200 tends to be strengthened. Thus, the first ground conductor 300 more easily achieves the desired characteristic impedance if the distance between the first ground conductor 300 and the signal conductor 200 is made larger, as compared with the second ground conductor 400. Therefore, as shown in FIG. 3, the thickness D1 of the dielectric layer 101 may be thicker than the thickness D2 of the dielectric layer 102.

Then, such a configuration increases the distance from the signal conductor 200 to the surface of the laminate 100 on the side of the dielectric layer 101. In other words, the height of the level difference on the side in which the connectors 71 and 72 for external connection are provided is made higher. This increases the allowable height of the connectors 71 and 72 for external connection, so that, for example, a structure in which the connectors 71 and 72 for external connection shown in FIG. 3 do not protrude from the surface of the laminate 100 on the side of the dielectric layer 101 is provided more easily. Therefore, the signal transmission cable 10 having a low transmission loss and a thin shape is provided more easily.

Figure 5A:
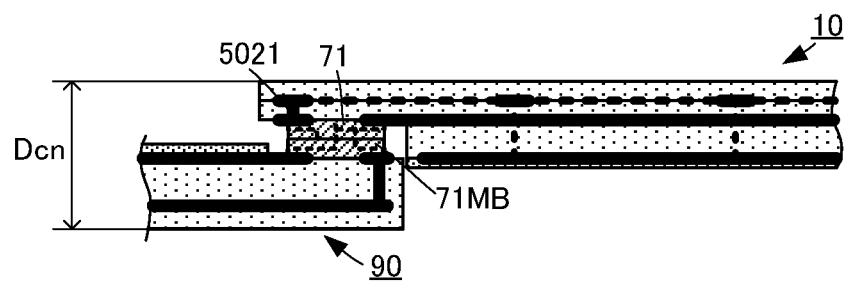
FIGS. 5A to 5C are side sectional views showing structures of a portion connected to the mother substrate when the signal transmission component according to the first preferred embodiment of the present invention is used and when the signal transmission component of the conventional configuration is used.
Figure 5B:
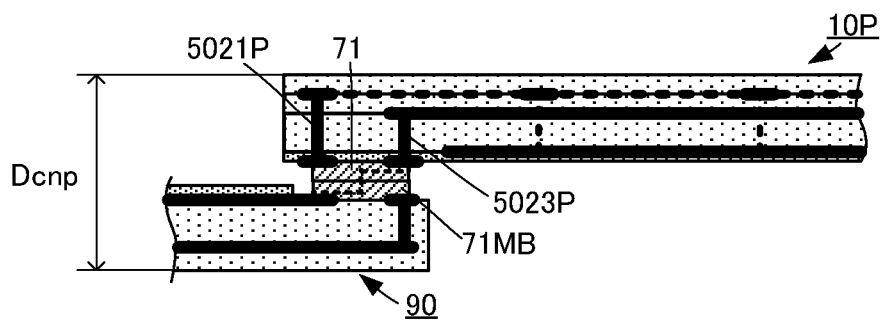
Figure 5C:
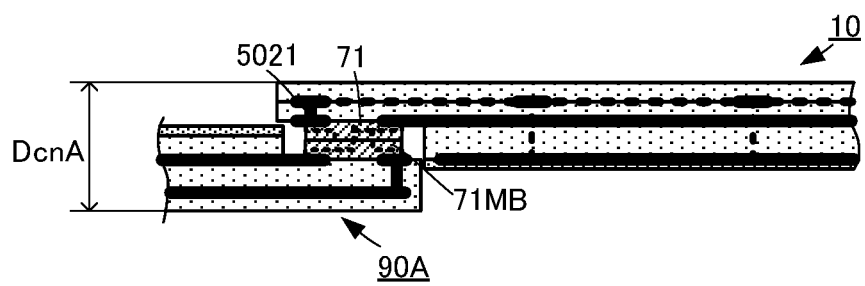

FIGS. 5A to 5C are side sectional views showing structures of a portion connected to the mother substrate when the signal transmission cable as the signal transmission component according to the present preferred embodiment of the present invention is used and when the signal transmission cable of the conventional configuration is used. FIG. 5A shows a case of using the signal transmission cable according to the present preferred embodiment of the present invention and FIG. 5B shows a case of using the signal transmission cable of the conventional configuration. FIG. 5C shows a case of using the signal transmission cable according to the present preferred embodiment of the present invention and also including in the mother substrate the structure of the connection portion of the signal transmission cable according to the present preferred embodiment of the present invention. It should be noted that FIGS. 5A to 5C schematically show the connection configuration of the transmission line of the mother substrate.

As shown in FIGS. 5A and 5B, the mother substrate 90 generally includes a mounting connector 71MB mounted on the surface of the mother substrate 90. As shown in FIG. 5B, in the conventional configuration, the thickness Dcnp of the connection portion of the signal transmission cable 10P and the mother substrate 90 is obtained by adding the thickness of the mother substrate 90, the thickness of the connector 71 for external connection and the mounting connector 71MB after being attached to each other, and the thickness of the signal transmission cable 10P. In contrast, as shown in FIG. 5A, in the configuration according to the present preferred embodiment of the present invention, the thickness Dcn of the connection portion of the signal transmission cable 10 and the mother substrate 90 is obtained by adding the thickness of the mother substrate 90, the thickness of the connector 71 for external connection and the mounting connector 71MB after being attached to each other, and the thickness of the first thin portion 191 of the signal transmission cable 10. Therefore, the thickness Dcn of the connection portion using the configuration according to the present preferred embodiment of the present invention is thinner than the thickness Dcnp of the connection portion according to the conventional configuration. This provides an electronic device in which the thickness of a connection portion of a signal transmission cable and a mother substrate is thin.

Furthermore, as shown in FIG. 5C, a structure similar to the structure of the signal transmission cable 10 is also applied to a mother substrate 90A, so that the thickness DcnA of the connection portion of the signal transmission cable 10 and the mother substrate 90A is obtained by adding the thickness of the thin portion of the mother substrate 90A, the thickness of the connector 71 for external connection and the mounting connector 71MB after being attached to each other, and the thickness of the first thin portion 191 of the signal transmission cable 10. Thus, this structure provides an electronic device in which the thickness of a connection portion of a signal transmission cable and a mother substrate is further reduced and made thinner.

Moreover, in the configuration according to the present preferred embodiment of the present invention, the signal conductor 200 and the connectors 71 and 72 for external connection are directly connected to each other and do not need to be connected through an interlayer connection conductor 5023P according to the conventional configuration as shown in FIG. 5B, so that the structure of the connection portion is simplified. This prevents a reduction in connection reliability due to a manufacturing error at a time of forming a connection portion. Therefore, a signal transmission cable having an external connection portion of which the reliability is higher than the reliability of the cable of the conventional configuration is provided. Furthermore, compared with a case in which an interlayer connection conductor and the like are provided between the signal conductor and the connector for external connection, the transmission loss between the signal conductor and the connector for external connection is significantly reduced or prevented.

Subsequently, a signal transmission cable as a signal transmission component according to a second preferred embodiment of the present invention will be described with reference to the drawings. FIGS. 6A to 6D are plan views of individual layers, showing a structure of the end portion of the signal transmission cable as the signal transmission component according to the second preferred embodiment of the present invention.

The signal transmission cable 10A according to the second preferred embodiment of the present invention differs from the signal transmission cable 10 according to the first preferred embodiment of the present invention in that a signal conductor 200A and a first ground conductor 300A have different configurations. Other components are preferably the same as the components of the signal transmission cable 10 according to the first preferred embodiment of the present invention, and overlapping description will be omitted.

The signal conductor 200A is defined by a first line portion $200A_{CN}$ and a second line portion $200A_{ED}$. The line width of the first line portion $200A_{CN}$ is the same as the line width of the signal conductor 200 according to the first preferred embodiment of the present invention. The positions of the opposite ends of the first line portion $200A_{CN}$ in the first direction are substantially the same as the positions in which the bridge conductors 403 at the opposite ends of the second ground conductor 400 are provided, respectively. The region in which the first line portion $200A_{CN}$ is provided is a first transmission line region $R_{CN}$.

The second line portion $200A_{ED}$ is connected to the opposite ends of the first line portion $200A_{CN}$ in the first direction and is defined as a linear conductor that extends to a thin portion. The line width of the second line portion $200A_{ED}$ is larger than the line width of the first line portion $200A_{CN}$. The region in which the second line portion $200A_{ED}$ is provided is a second transmission line region $R_{ED}$.

The first ground conductor 300A is provided in the first transmission line region $R_{CN}$ and is not provided in the second transmission line region $R_{ED}$.

In such a configuration, the first transmission line region $R_{CN}$ includes a dielectric stripline defined by the first line portion $200A_{CN}$ of the signal conductor 200A and the first and second ground conductors 300A and 400. The first transmission line region $R_{CN}$ has the characteristic impedance the same as the characteristic impedance of the main line portion 190 of the signal transmission cable 10 according to the first preferred embodiment of the present invention.

The second transmission line region $R_{ED}$ includes a microstrip line defined by the second line portion $200A_{ED}$ of the signal conductor 200A and the second ground conductor 400. In the present preferred embodiment of the present invention, the second transmission line region $R_{ED}$ has the larger line width of the second line portion $200A_{ED}$, so that the capacitive coupling between the second line portion $200A_{ED}$ and the second ground conductor 400 is significantly increased or maximized. Thus, even when the second ground conductor 400 including the conductor non-formed portion 410 is used, that is, even when the second line portion $200A_{ED}$ and the second ground conductor 400 are not overlapped in a plan view, the characteristic impedance of the second transmission line region $R_{ED}$ is equal or substantially equal or close to the characteristic impedance of the first transmission line region $R_{CN}$. This easily achieves the impedance matching between the first transmission line region $R_{CN}$ and the second transmission line region $R_{ED}$ and provides a signal transmission cable 10A having a low loss since the characteristic impedance between the first transmission line region $R_{CN}$ and the second transmission line region $R_{ED}$ does not largely vary.

It is to be noted that, while the present preferred embodiment of the present invention shows an example in which the boundary of the first transmission line region $R_{CN}$ and the second transmission line region $R_{ED}$ preferably is not matched with the boundary of the main line portion 190 and the first thin portion 191, a configuration in which the boundaries are matched can be used.

Subsequently, a signal transmission cable as a signal transmission component according to a third preferred embodiment of the present invention will be described with reference to the drawings. FIGS. 7A to 7D are plan views of individual layers, showing a configuration of the end portion of the signal transmission cable as the signal transmission component according to the third preferred embodiment of the present invention. It should be noted that FIGS. 7A to 7D show a shape of a second ground conductor 400B to help clarify how conductor patterns are overlapped with each other in a plan view.

The signal transmission cable 10B according to the third preferred embodiment of the present invention differs from the signal transmission cable 10A according to the second preferred embodiment of the present invention in that a signal conductor 200B and a second ground conductor 400B have different configurations. Other components are the same as the components of the signal transmission cable 10A according to the second preferred embodiment of the present invention, and overlapping description will be omitted.

The signal conductor 200B is defined by a first line portion 200B$_{CN}$ and second line portions 200B$_{ED1}$ and 200B$_{ED2}$. The line width of the first line portion 200B$_{CN}$ preferably is the same or substantially the same as the line width of the signal conductor 200 according to the first preferred embodiment of the present invention. The positions of the opposite ends of the first line portion 200B$_{CN}$ in the first direction are preferably the same or substantially the same as the positions in which the bridge conductors 403 at the opposite ends of the second ground conductor 400B are provided, respectively. The region in which the first line portion 200A$_{CN}$ is provided is a first transmission line region R$_{CN}$.

The second line portion 200B$_{ED1}$ is connected to the opposite ends of the first line portion 200B$_{CN}$ in the first direction, and the second line portion 200B$_{ED2}$ is connected to the second line portion 200B$_{ED1}$ on the opposite side of the first line portion 200B$_{CN}$. The second line portion 200B$_{ED2}$ is a mounting land of the connector 71 for external connection. The second line portions 200B$_{ED1}$ and 200B$_{ED2}$ are linear conductors in which at least the second line portion 200B$_{ED2}$ extends to a thin portion. The line width of the second line portion 200B$_{ED1}$ is smaller than the line width of the first line portion 200A$_{CN}$ and the second line portion 200B$_{ED2}$. The region in which the second line portions 200B$_{ED1}$ and 200B$_{ED2}$ are provided is a second transmission line region R$_{ED}$.

The second ground conductor 400B has a structure in which no conductor non-formed portion 410 is provided in the second transmission line region R$_{ED}$. In other words, as shown in FIG. 7C, an end bridge conductor 403B$_{ED}$' is provided in the entire second transmission line region R$_{ED}$.

When the conductor non-formed portion 410 is not provided on the second ground conductor in the second transmission line region R$_{ED}$, when the width of the signal conductor is made the same at every position in the first direction, the characteristic impedance becomes lower than when the conductor non-formed portion 410 is provided on the second ground conductor 400. However, in the configuration according to the present preferred embodiment of the present invention, since the line width of the second line portion 200B$_{ED1}$ in the second transmission line region R$_{ED}$ is small, even if the conductor non-formed portion 410 is not provided on the second ground conductor 400B, the characteristic impedance of this region is made high. Accordingly, the impedance matching between the first transmission line region R$_{CN}$ and the second transmission line region R$_{ED}$ is achieved, and also the signal transmission cable 10B having a low loss is provided. Furthermore, since the line width of the second line portion 200B$_{ED2}$ on which the connector for external connection is mounted is not smaller, the reliability of connection with the connector 71 for external connection is ensured.

In addition, since the conductor non-formed portion 410 is not provided on the second ground conductor 400B, the insulation shield properties of this portion are improved.

Moreover, the use of the configuration according to the present preferred embodiment of the present invention is effectively applied to a bending mode to be described later. Specifically, with the structure according to the present preferred embodiment of the present invention, the entire region corresponding to the thin portion of the second ground conductor 400B is the end bridge conductor 403B$_{ED}$'. Thus, shape retention properties after bending are improved.

Figure 8A:
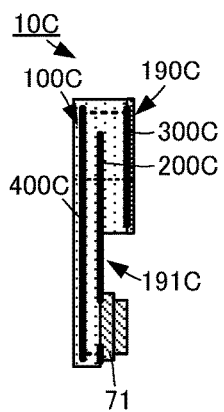
FIG. 8A and FIG. 8B are a side sectional view and a plan view, respectively, showing a configuration of a signal transmission component according to a fourth preferred embodiment of the present invention.
Figure 8B:
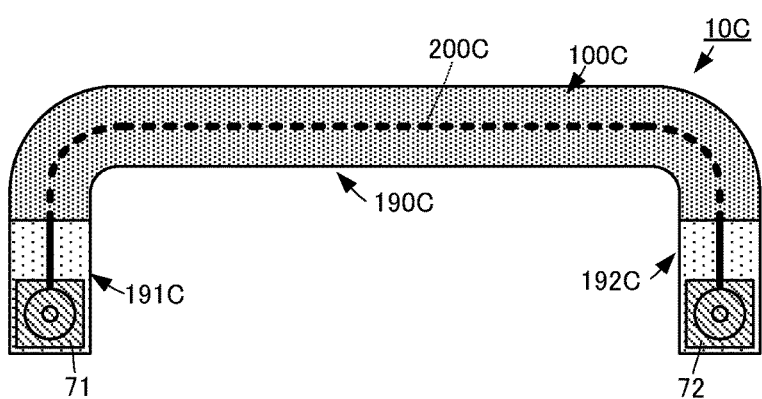

Subsequently, a signal transmission cable as a signal transmission component according to a fourth preferred embodiment of the present invention will be described with reference to the drawings. FIGS. 8A and 8B are a side sectional view and a plan view showing a configuration of a signal transmission cable as a signal transmission component according to the fourth preferred embodiment of the present invention. FIG. 8A is a side sectional view and FIG. 8B is a plan view. It is to be noted that the side sectional view schematically shows only the main components of the signal transmission cable.

The signal transmission cable 10C according to the fourth preferred embodiment of the present invention differs from the signal transmission cable 10 according to the first preferred embodiment of the present invention in that a main line portion 190C has a different shape. Other components are the same as the components of the signal transmission cable 10 according to the first preferred embodiment of the present invention, and overlapping description will be omitted.

The main line portion 190C of the signal transmission cable 10C curves in the middle in the extending direction. It should be noted that a curve shows a state in which the surface of the main line portion 190C and the surfaces of first and second thin portions 191C and 192C are on the same plane and have different extending directions. In the example of FIGS. 8A and 8B, the opposite ends of the main line portion 190C curves at an angle of approximately 90 degrees with respect to the center portion of the main line portion 190C. The first and second thin portions 191C and 192C have the same shape as the first and second thin portions 191 and 192 according to the first preferred embodiment of the present invention.

It is to be noted that the curving angle and the number of curved portions in the signal transmission cable 10C are not limited to this example.

Figure 9A:
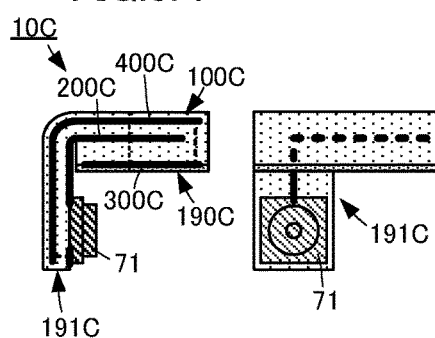
FIGS. 9A to 9C are views showing an example of a use mode of the signal transmission component according to the fourth preferred embodiment of the present invention.
Figure 9B:
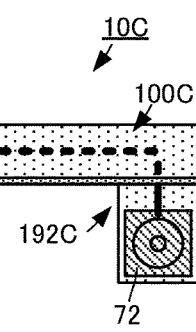
Figure 9C:
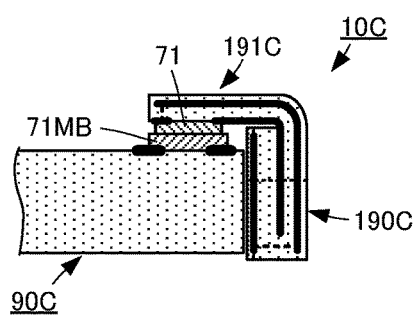

FIGS. 9A to 9C are views showing an example of a use mode of the signal transmission cable as the signal transmission component according to the fourth preferred embodiment of the present invention. FIG. 9A is a side sectional view and FIG. 9B is a plan view. FIG. 9C is a side section view showing a specific example of the use mode.

As shown in FIG. 9A and FIG. 9B, the signal transmission cable 10C bends so that the center portion in the middle of the curving portion in the main line portion 190C may form approximately 90 degrees with respect to the first and second thin portions 191C and 192C. In the example, a bend shows a state in which the surfaces of the first and second thin portions 191C and 192C and the surface of the main line portion 190C are provided to form an angle (90 degrees in FIGS. 9A to 9C). In such a case, a bent position is an intermediate position in the extending direction of the first and second thin portions 191C and 192C. This enables the signal transmission cable 10C to be more easily bent than the main line portion 190C. Furthermore, the boundary portion of the first and second thin portions 191C and 192C and the main line portion 190C is a bent position, which can accurately set the bent position.

Such a bent signal transmission cable 10C, for example, as shown in FIG. 9C, connects the connectors 71 and 72 for external connection of the signal transmission cable 10C to the mounting connector 71MB of the mother substrate 90C in a state in which the first and second thin portions 191C and 192C are arranged to face the surface of the mother substrate 90C and the main line portion 190C is arranged to face the side surface of the mother substrate 90C. According to this configuration, the area in which the signal transmission cable 10C is arranged on the surface of the mother substrate 90C preferably is only a substantial mounting portion.

It should be noted that, while the present preferred embodiment of the present invention shows a state in which the connectors 71 and 72 for external connection preferably are bent so that the surfaces on which the connectors 71 and 72 for external connection are mounted may face the main line portion 190C, there is no limitation to the bending angle.

Figure 10:
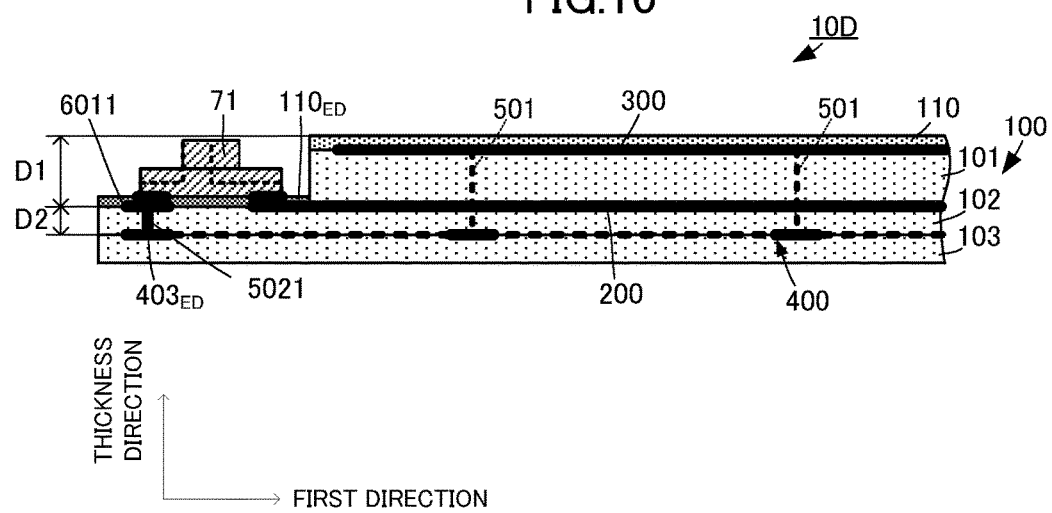
FIG. 10 is a plan view showing a configuration of an end portion of a signal transmission component according to a fifth preferred embodiment of the present invention.

Subsequently, a signal transmission cable as a signal transmission component according to a fifth preferred embodiment of the present invention will be described with reference to the drawings. FIG. 10 is a plan view showing a configuration of an end portion of the signal transmission cable as the signal transmission component according to the fifth preferred embodiment of the present invention.

The signal transmission cable 10D according to the fifth preferred embodiment of the present invention is a cable obtained by adding an insulating resist film $110_{ED}$ to the signal transmission cable 10 according to the first preferred embodiment of the present invention. Other components are the same as the components of the signal transmission cable 10A according to the first preferred embodiment of the present invention, and overlapping description will be omitted.

As shown in FIG. 10, the surface of the thin portion of the signal transmission cable 10D, that is, the signal conductor 200 is exposed and the insulating resist film $110_{ED}$ is attached on the surface on which the connector 71 for external connection is provided. The resist film $110_{ED}$ is attached on the substantially whole area of the surface of the thin portion except for the position in which the connector 71 for external connection is provided.

With such a configuration, the signal conductor 200 and the mounting land conductors 6011, 6012, and 6013 (the mounting land conductors 6012 and 6013 are not shown) in the thin portion are insulated and protected from the outside environment. Accordingly, a signal transmission with high reliability cable is achieved.

It is to be noted that, while the preferred embodiments of the present invention describe the signal transmission component as the signal transmission cable, the component is not limited to the preferred embodiments and may be a component including the structure of the present invention in a portion of a wiring substrate including other circuit elements and the like, for example.

Finally, the above described preferred embodiments are to be considered in all respects as illustrative and not restrictive. The scope of the present invention is defined by the following claims, not by the foregoing preferred embodiments. Further, the scope of the present invention is intended to include the scopes of the claims and all possible changes and modifications within the senses and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission component comprising:
   a laminate including a plurality of dielectric layers that are laminated on each other, the plurality of dielectric layers each including a conductor pattern with a flat film shape and having flexibility;
   a signal conductor that is defined, in the laminate, by the conductor pattern, has a linear shape, and extends in a direction perpendicular to a lamination direction of the laminate;
   a first ground conductor and a second ground conductor that are defined by a conductor pattern different from the signal conductor, in an extending direction so as to extend parallel or substantially parallel to the signal conductor, have a flat film shape, and hold the signal conductor between the first ground conductor and the second ground conductor in the lamination direction; and
   a connector for external connection that is connected to at least one of opposite ends of the signal conductor, wherein
   the laminate includes a thinned portion of which a thickness in the lamination direction is reduced at an end portion;
   no first ground conductor is located at the thinned portion;
   the signal conductor is connected to the connector for external connection at the end portion;
   the connector for external connection is located on a surface of the thinned portion, on a side in which the thinned portion causes the laminate to have a difference in level; and
   the laminate is bent in the lamination direction at the thinned portion.

2. The signal transmission component according to claim 1, wherein the laminate is bent on a border of a main line portion, of which a thickness is thicker than a thickness of the thinned portion, and the thinned portion.

3. The signal transmission component according to claim 1, wherein the thinned portion of the second ground conductor includes no conductor non-formed portions.

4. The signal transmission component according to claim 1, wherein the surface of the thinned portion on which the connector for external connection is located is a layer surface of one of the plurality of dielectric layers that includes the signal conductor.

5. The signal transmission component according to claim 1, wherein
   the second ground conductor includes a plurality of conductor non-formed portions in the extending direction; and
   a thickness of at least one dielectric layer of the plurality of dielectric layers between the signal conductor and the first ground conductor is thicker than a thickness of at least one dielectric layer of the plurality of dielectric layers between the signal conductor and the second ground conductor.

6. The signal transmission component according to claim 1, wherein
   the laminate includes a main line portion of which a thickness is thicker than a thickness of the thinned portion; and
   a line width of the signal conductor is larger in the thinned portion than in the main line portion.

7. The signal transmission component according to claim 1, wherein
   the laminate includes a main line portion of which a thickness is thicker than a thickness of the thinned portion; and
   a line width of the signal conductor is smaller in the thinned portion than in the main line portion.

8. The signal transmission component according to claim 1, wherein the thinned portion includes first and second thinned portions provided on opposite ends of the laminate.

9. An electronic device comprising:
a signal transmission component, and
a mother substrate; wherein
the signal transmission component includes:
- a laminate including a plurality of dielectric layers that are laminated on each other, the plurality of dielectric layers each including a conductor pattern with a flat film shape and having flexibility;
- a signal conductor that is defined, in the laminate, by the conductor pattern, has a linear shape, and extends in a direction perpendicular to a lamination direction of the laminate;
- a first ground conductor and a second ground conductor that are defined by a conductor pattern different from the signal conductor, in an extending direction so as to extend parallel or substantially parallel to the signal conductor, have a flat film shape, and hold the signal conductor between the first ground conductor and the second ground conductor in the lamination direction; and
- a connector for external connection that is connected to at least one of opposite ends of the signal conductor;

wherein
the laminate includes a thinned portion of which a thickness in the lamination direction is reduced at an end portion;
no first ground conductor is located at the thinned portion;
the signal conductor is connected to the connector for external connection at the end portion;
the laminate is bent in the extending direction to the lamination direction;
the connector for external connection is located on a surface of the thinned portion, on a side in which the thinned portion causes the laminate to have a difference in level;
the laminate is bent in the lamination direction at the thinned portion;
the mother substrate includes a mounting connector to which the connector for external connection is connected;
the mounting connector is located on a side of a surface, on which the connector for external connection is connected, of the mother substrate; and
the connector for external connection is connected to the mounting connector with the signal transmission component being bent.

10. The electronic device according to claim 9, wherein the laminate is bent on a border of a main line portion, of which a thickness is thicker than a thickness of the thinned portion, and the thinned portion.

11. The electronic device according to claim 9, wherein the thinned portion of the second ground conductor includes no conductor non-formed portions.

12. The electronic device according to claim 9, wherein the surface of the thinned portion on which the connector for external connection is located is a layer surface of one of the plurality of dielectric layers that includes the signal conductor.

13. The electronic device according to claim 9, wherein
the second ground conductor includes a plurality of conductor non-formed portions in the extending direction; and
a thickness of at least one dielectric layer between the signal conductor and the first ground conductor is thicker than a thickness of at least one dielectric layer between the signal conductor and the second ground conductor.

14. The electronic device according to claim 9, wherein
the laminate includes a main line portion of which a thickness is thicker than a thickness of the thinned portion; and
a line width of the signal conductor is larger in the thinned portion than in the main line portion.

15. The electronic device according to claim 9, wherein
the laminate includes a main line portion of which a thickness is thicker than a thickness of the thinned portion; and
a line width of the signal conductor is smaller in the thinned portion than in the main line portion.

16. The electronic device according to claim 9, wherein the thinned portion includes first and second thinned portions provided on opposite ends of the laminate.

17. The electronic device according to claim 9, wherein
the mother substrate includes a mother side thinned portion on a side of a surface on which the connector for external connection is connected; and
the mounting connector is located on a surface of the mother side thinned portion.

* * * * *